United States Patent
Yabe

(10) Patent No.: US 7,388,651 B2
(45) Date of Patent: Jun. 17, 2008

(54) FOCUS MONITORING METHOD

(75) Inventor: Sachiko Yabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 468 days.

(21) Appl. No.: 11/226,432

(22) Filed: Sep. 15, 2005

(65) Prior Publication Data

US 2006/0103823 A1 May 18, 2006

(30) Foreign Application Priority Data

Nov. 15, 2004 (JP) .............................. 2004-330184

(51) Int. Cl.
 *G03B 27/52* (2006.01)
 *G03B 27/32* (2006.01)
(52) U.S. Cl. .......................................... 355/55; 355/77
(58) Field of Classification Search ................ 355/52, 355/53, 55, 77; 356/399–401; 430/5, 20, 430/30, 311; 250/548
See application file for complete search history.

(56) References Cited

U.S. PATENT DOCUMENTS 5,408,083 A * 4/1995 Hirukawa et al. ....... 250/201.2
5,783,833 A * 7/1998 Sugaya et al. ............. 250/548
6,376,139 B1 * 4/2002 Fujisawa et al. ............. 430/30
6,440,616 B1 8/2002 Izuha et al.

FOREIGN PATENT DOCUMENTS

JP 2001-189264 7/2001

OTHER PUBLICATIONS

"Edge Die Focus-Exposure Monitoring and Compensation to Improve CD Distributions".
Venky Subramony et al. Tech Semiconductor, 1 Woodlands Industrial Park D, Street D, Singapore 738799 ;pp. 978-985, SPIE vol. 5375 (2003).

* cited by examiner

*Primary Examiner*—Hung Henry Nguyen
(74) *Attorney, Agent, or Firm*—Kubotera & Associates, LLC

(57) ABSTRACT

A shot of a focus-monitoring mark is provided on a wafer at a first focus position ($\Delta DF$) defocused from a second focus position (Fk) by a certain amount to measure a dimension (La) of the focus-monitoring mark. The actual focus position (F) of the defocused shot is calculated by the measured dimension (La) and the defocused direction of the defocused shot, using a calibration quadratic function curve (1). The difference ($F-\Delta DF$) between the actual focus position and the defocused amount represents the magnitude and direction of deviation of the actual focus position from the optimum focus position.

12 Claims, 12 Drawing Sheets

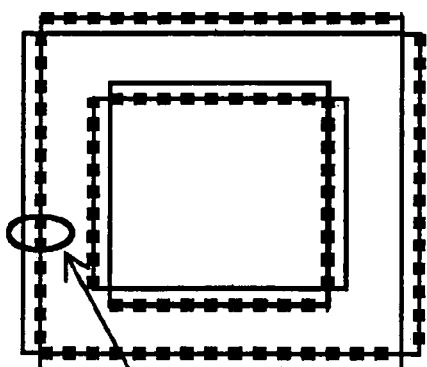
FIG. 1 (a)
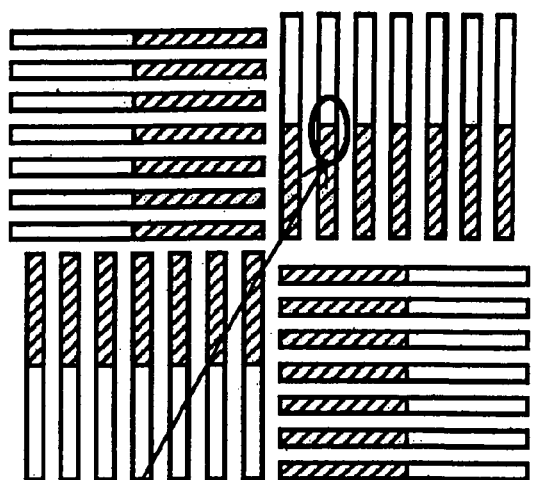
FIG. 1 (b)
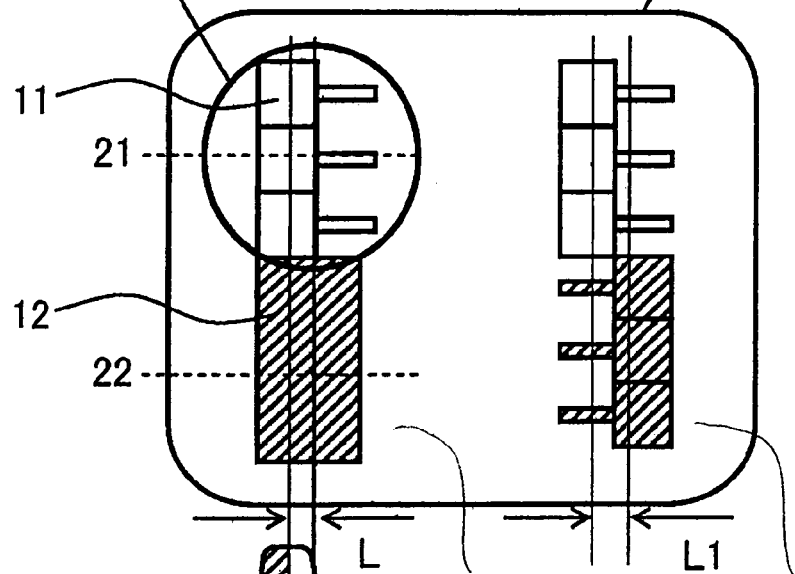
FIG. 1 (c)   FIG. 1 (d)
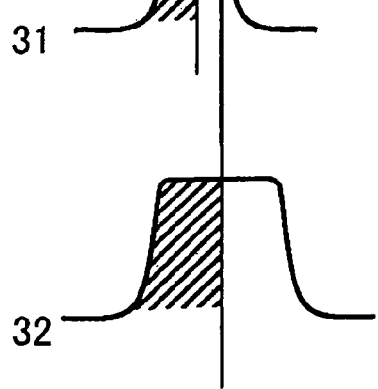

FIG. 14 (a) PRIOR ART
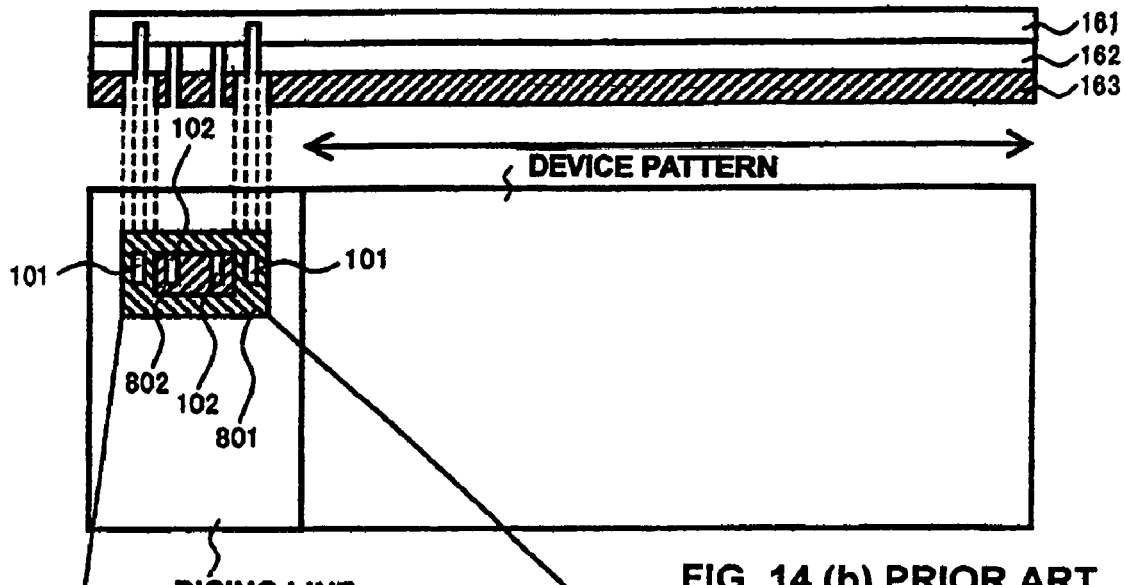
FIG. 14 (b) PRIOR ART
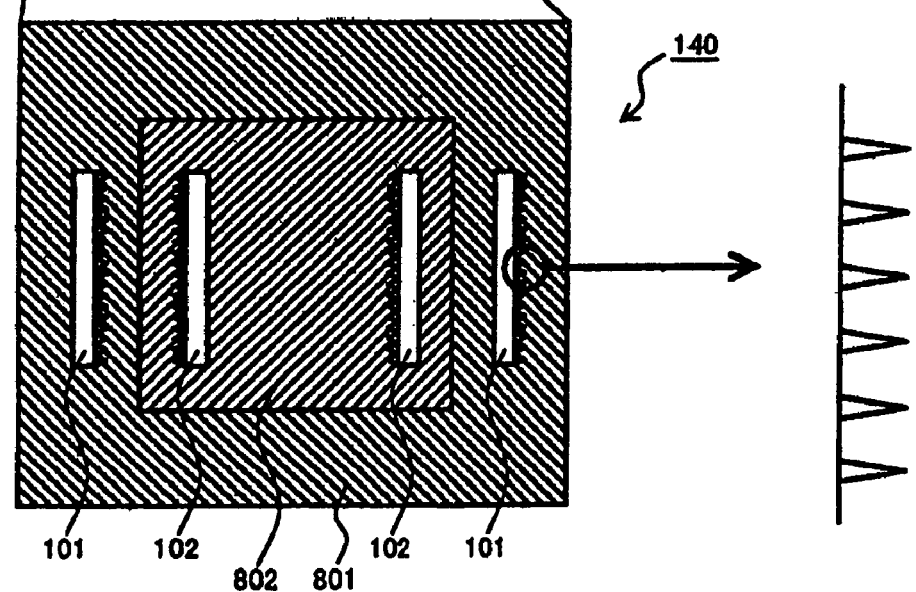
FIG. 14 (c) PRIOR ART
FIG. 14 (d) PRIOR ART

PATTERN ON WAFER

DEVIATION = S2 − S1

FOCUS MONITORING METHOD

CROSS-REFERENCE TO RELATED APPLICATIONS

This application is based upon and claims the benefit of priority from the prior Japanese Patent Application No. 2004-330184, filed Nov. 15, 2004, the entire contents of which are incorporated herein by reference.

BACKGROUND OF THE INVENTION

The present invention relates to a focus monitoring method which is suited for controlling a focus condition of exposure equipment used for photolithography in manufacturing a semiconductor device or a liquid crystal display device.

In the photolithography process of manufacturing a semiconductor device or a liquid crystal display device, the focus can be dislocated or deviated from the predetermined focus point because of the unevenness of the surface of a wafer caused by mechanical impreciseness of exposure equipment and/or irregularity of process condition. Such a focus-deviation can produce deviation of a pattern transferred onto the wafer and reduce the production yield.

According to a conventional method, a focus-monitoring pattern is provided in a reticule, which is transferred onto the wafer, and the dimension of the transferred focus-monitoring pattern is periodically monitored to detect the focus-deviation, then, the focus is corrected according to the result of the detection to prevent the reduction of the manufacturing yield.

With the recent advance of the technology for a very fine device pattern, it has been difficult to secure a sufficient process margin of the value of exposure and the depth of focus during the photolithography. Therefore, there is a demand for a new technology enabling to precisely monitor the focus of exposure equipment by utilizing a small process margin in order to prevent the reduction of the manufacturing yield.

Conventional focus-monitoring methods are described below. In non-patent document entitled "Edge Die Focus-Expose Monitoring and Comparison to Improve CD Distributions" (Proceedings of SPIE Vol. 5375), a reticule having a focus-monitoring pattern (mark) formed by a plurality of fine lines 15 such as shown in FIG. 12 has been used. The quantity or magnitude of retreat of the ends of such fine lines is sensitive to the focus. Accordingly, precise focus-monitoring is possible by monitoring the quantity of the end-retreat of the fine lines. In FIG. 12, a dimension L between the fine lines 15 of a focus-monitoring pattern is measured to substantially monitor the quantity of the end-retreat of the fine lines.

FIG. 13 shows the relationship between the dimension L and the focus position, wherein the focus position of the most suitable or optimum focus is located at the origin of the coordinate axes. The horizontal axis (x-axis) denotes the focus position and the vertical axis (y-axis) denotes the dimension L. In this specification, the optimum focus means the focus position at which the desired characteristics of a manufactured product are obtained. As shown in FIG. 13, the dimension L is variable substantially symmetrically in respect to the focus position. Data, which is shown in the FIG. 13, is obtained in advance before focus-monitoring in order to utilize the above-mentioned relationship between the focus position and the dimension L as a calibration curve. The dimension L at the shot of the optimum focus is measured and the actual focus position is determined from the dimension L of the optimum focus and the calibration curve. The difference between the obtained focus position and the optimum focus is the quantity of the focus-deviation.

This conventional method, however, has the following disadvantages.

As described above, the dimension L of a focus-monitoring pattern is changed substantially symmetrically with respect to the focus position (FIG. 13), which means that there is a plurality of solutions of the focus position even if the dimension L is determined. Therefore, the focus position is not determined uniquely from the calibration curve of the focus position and also the direction of the focus-deviation can not be determined. Accordingly, when the focus position is corrected, the correction in the direction of focus-deviation has been made in accordance with some assumption. For the above reasons, it has been difficult to set suitable focus conditions.

Also, the change of the dimension L with respect to the focus position is not sensitive in the vicinity of the focus position where the calibration curve passes the extreme value. It reduces the precision of the focus-monitoring. The optimum focus is usually set in the vicinity of the focus position at the extreme value of the calibration curve because the focus characteristics of the device region, which becomes a judging criterion for the optimum focus, are similar to those of the focus-monitoring pattern. For these reasons, it is natural that the precision of the focus-monitoring is reduced in the vicinity of the optimum focus.

In Japanese Patent Application Kokai Number 2001-189264, it is proposed that the defocus characteristics of two focus-monitoring patterns are changed by intentionally providing a phase difference to lights passing through the two focus-monitoring patterns in order to precisely monitor the focus-deviation including the direction.

FIG. 14 illustrates the outline of such a method. FIG. 14(a) is a sectional view of a reticule. The reticule is composed of three layers; a glass board 161, a semi-transparent film 162, and a light shielding film 163. FIG. 14(b) is a plan view of the reticule, FIG. 14(c) is a plan view of a focus-monitoring pattern 140, and FIG. 14(d) is a partly enlarged plan view of the focus-monitoring pattern 140. The focus-monitoring pattern 140 has a semi-transparent film section 801 in the periphery, a shielding film section 802 in the center, first monitor marks 101 constituting opening sections, and second monitor marks 102 constituting opening sections. Each of the first and second monitor marks 101 and 102 has a rectangular pattern and a fine tapered pattern (FIG. 14(d)) formed on one side of the rectangular pattern. For the purpose of providing a phase difference of right (90 degrees) angles between the exposure light passing through the semi-transparent film and the exposure light passing through the opening section, a portion of the glass board 161, where the first monitor mark 101, is located is etched down to a depth of, for example, 124 nm, as shown in FIG. 14(a).

FIG. 15 shows a difference in the quantity or magnitude of the focus deviation relative to the defocus of the first and second monitoring marks 101 and 102. FIG. 16 shows the magnitude of deviation S (=S2−S1) of the relative positions between the first and second monitoring marks 101 and 102. FIG. 17 shows the relationship between the defocus and the magnitude of deviation S from the optimum focus. Since the magnitude of deviation S is monotonically increased, the magnitude of deviation S can be monitored including the direction of deviation S.

As described above, in Japanese Patent Application Kokai Number 2001-189264, the special technique is required so that a part of the glass reticule is not useful for the monitoring.

In addition, as for one of the two monitoring marks, as shown in FIG. 15, since the measurement is taken in the vicinity of the focus position at the extreme value of the calibration curve, the precision of the focus-monitoring is reduced in the same way as the above-mentioned non-patent document.

BRIEF SUMMARY OF THE INVENTION

Accordingly, an object of the present invention is to provide a focus-monitoring method capable of precisely and easily detecting the magnitude of a focus deviation as well as the direction of the deviation, thereby improving the exposure precision.

According to the present invention, a shot of a focus-monitoring mark is provided on a wafer at a first focus position defocused from a second focus position by a certain amount to measure a dimension of the focus-monitoring mark. The actual focus position of the defocused shot is calculated by the measured dimension and the defocused direction of the defocused shot, using a calibration quadratic function curve. The difference between the actual focus position and the defocused amount represents the magnitude and direction of deviation of the actual focus position from the optimum focus position. According to the present invention, the magnitude and the direction of deviation of a focus position can be detected very precisely and easily.

BRIEF DESCRIPTION OF THE DRAWAINGS

FIGS. 1($a$), ($b$), ($c$), and ($d$) are plan views of a focus-monitoring mark according to an embodiment of the present invention;

Figure 4:
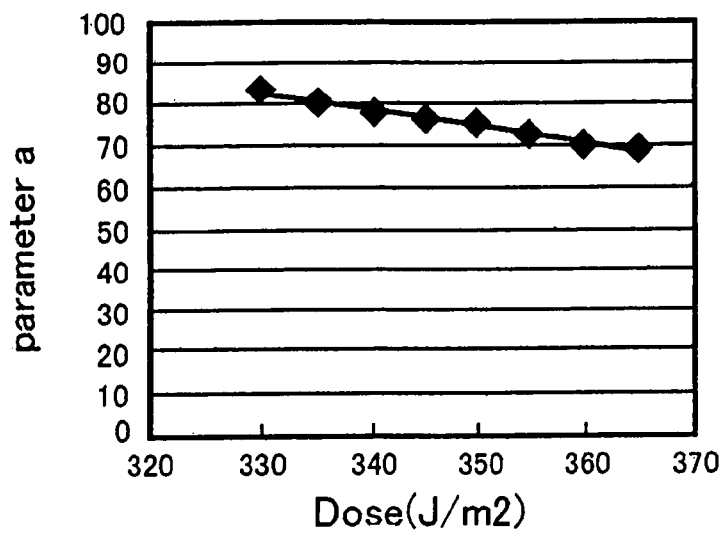
Figure 4:
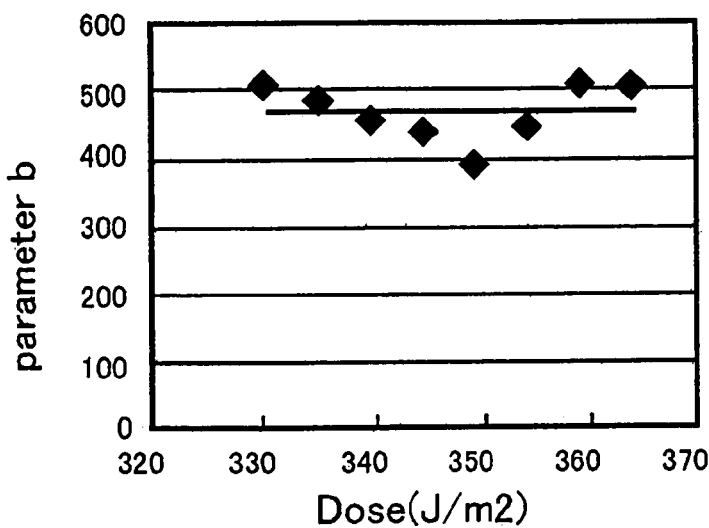
Figure 4:
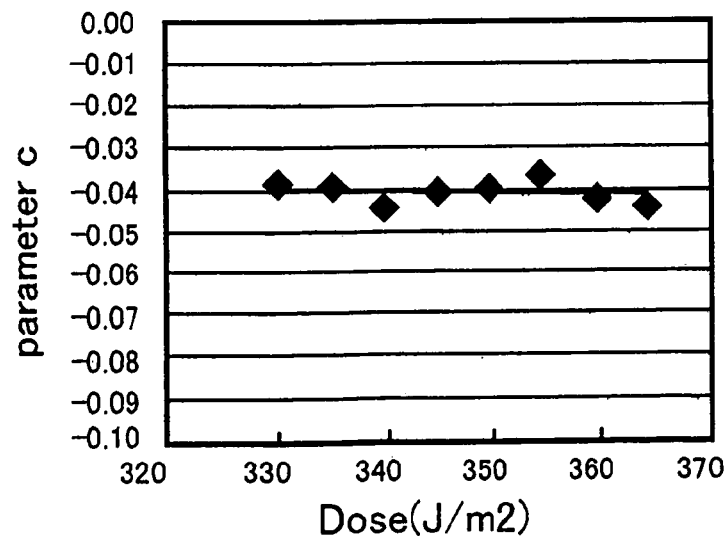
Figure 5:
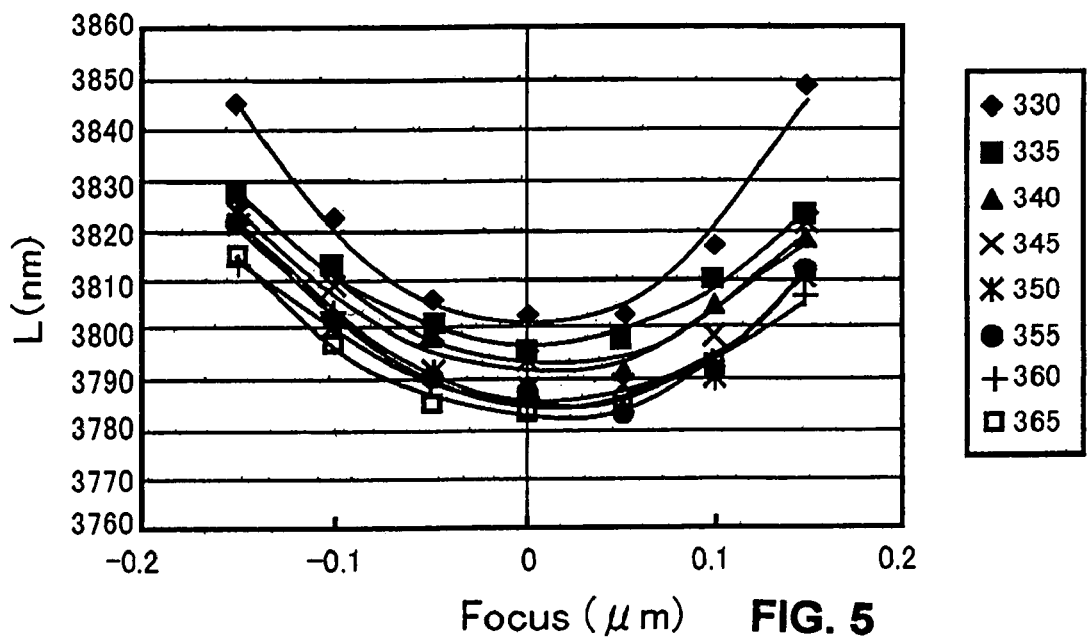
Figure 6:
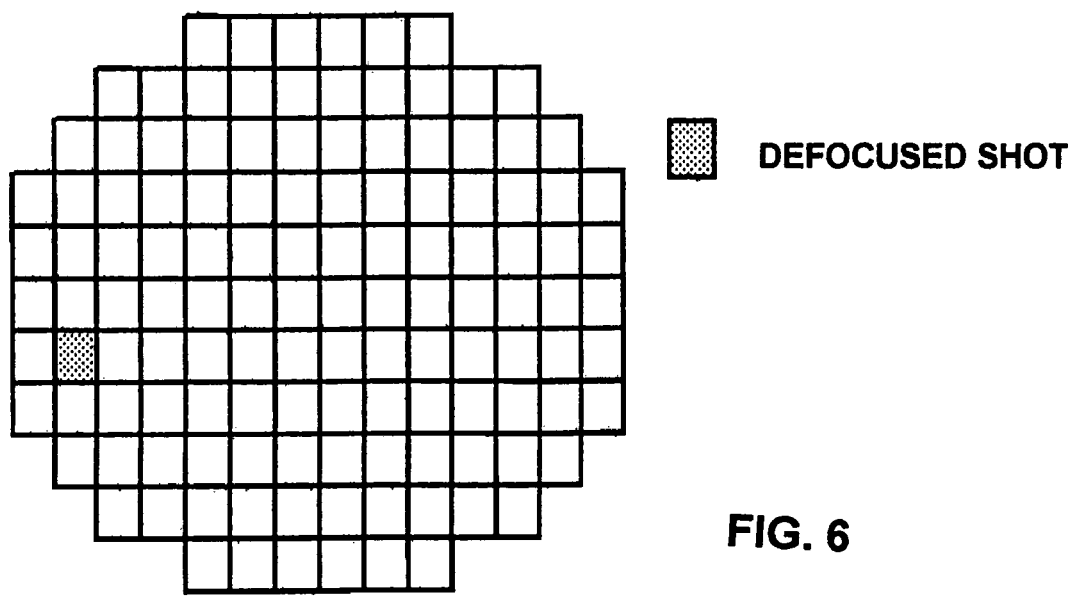
Figure 7:
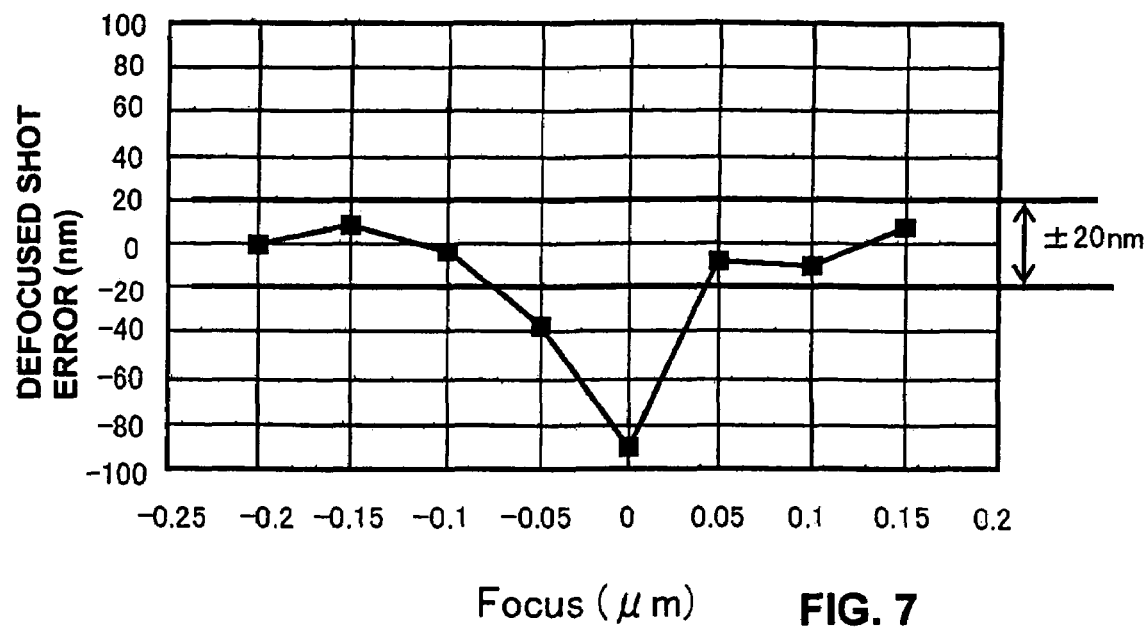
Figure 8:
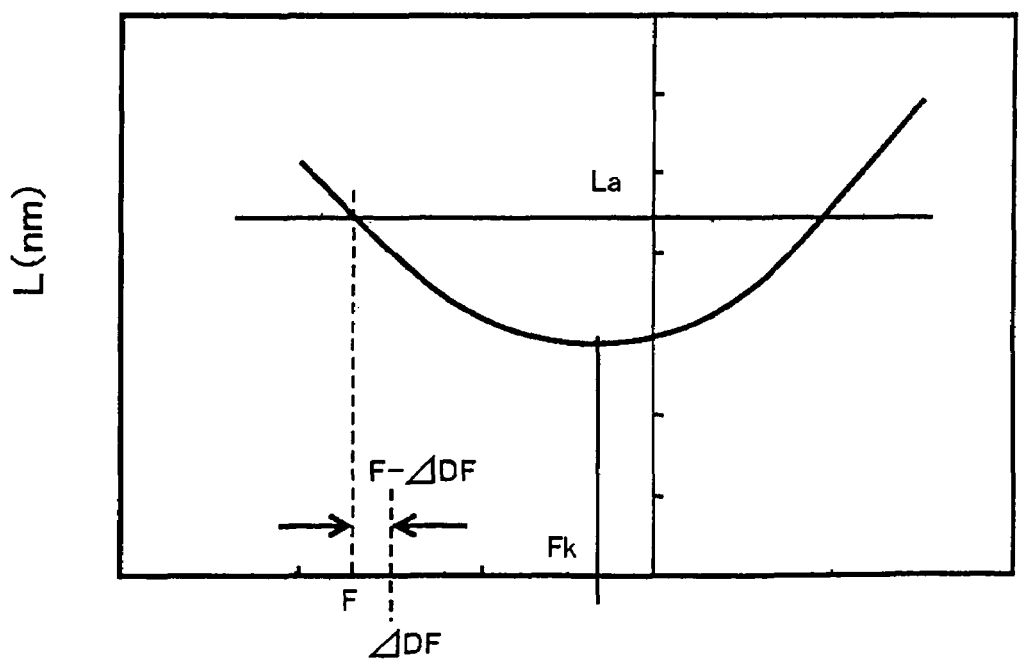
Figure 9:
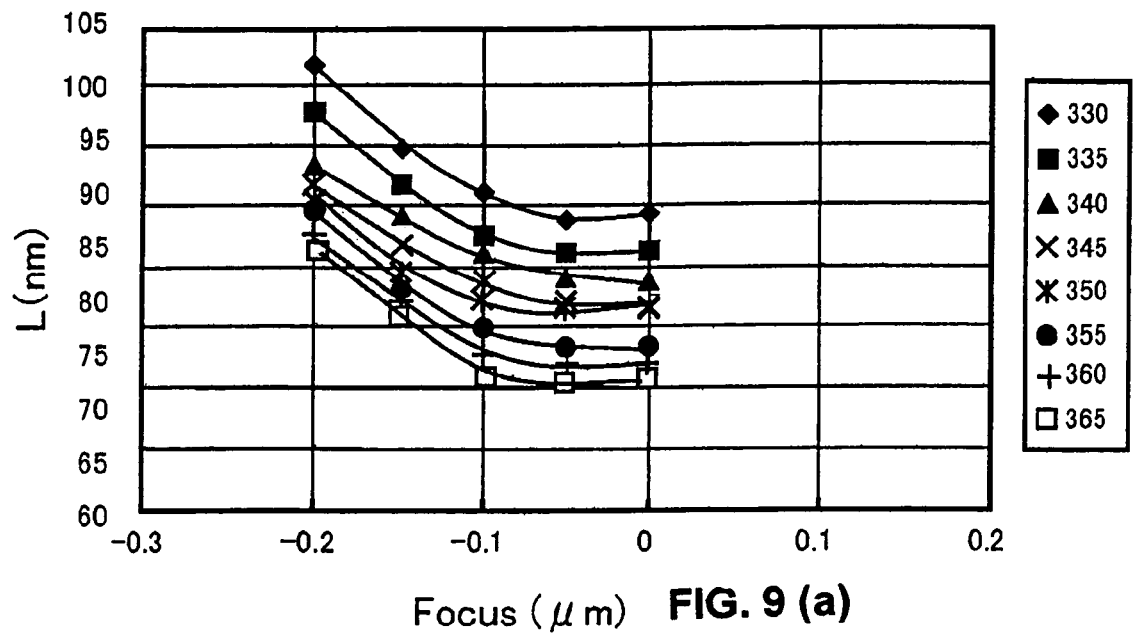
Figure 9:
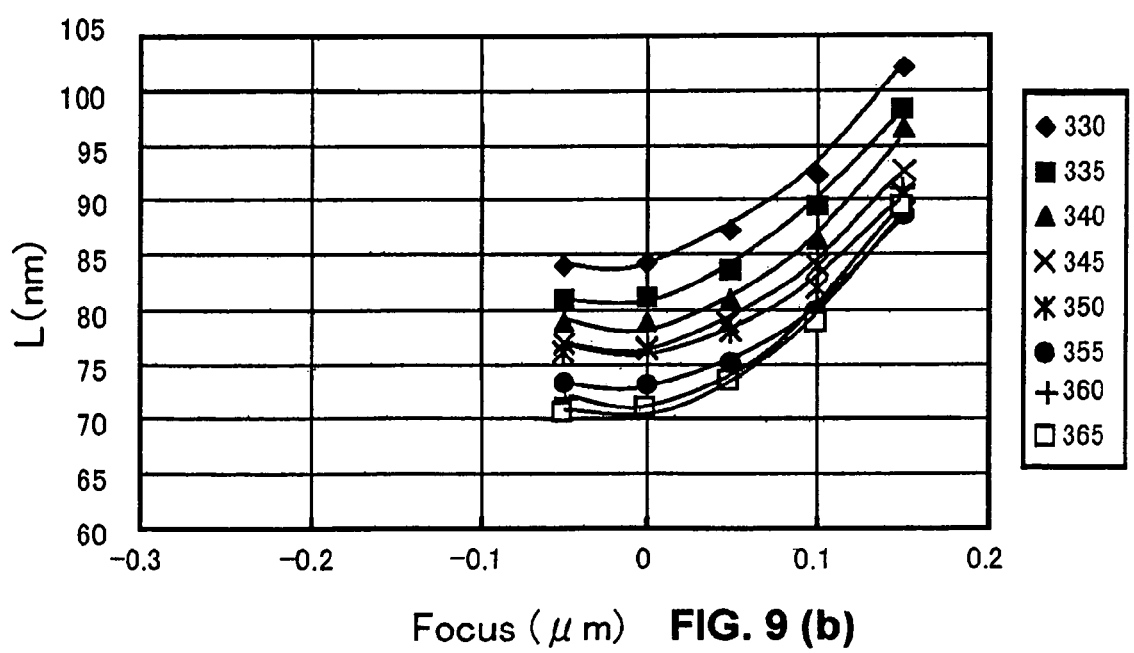
Figure 10:
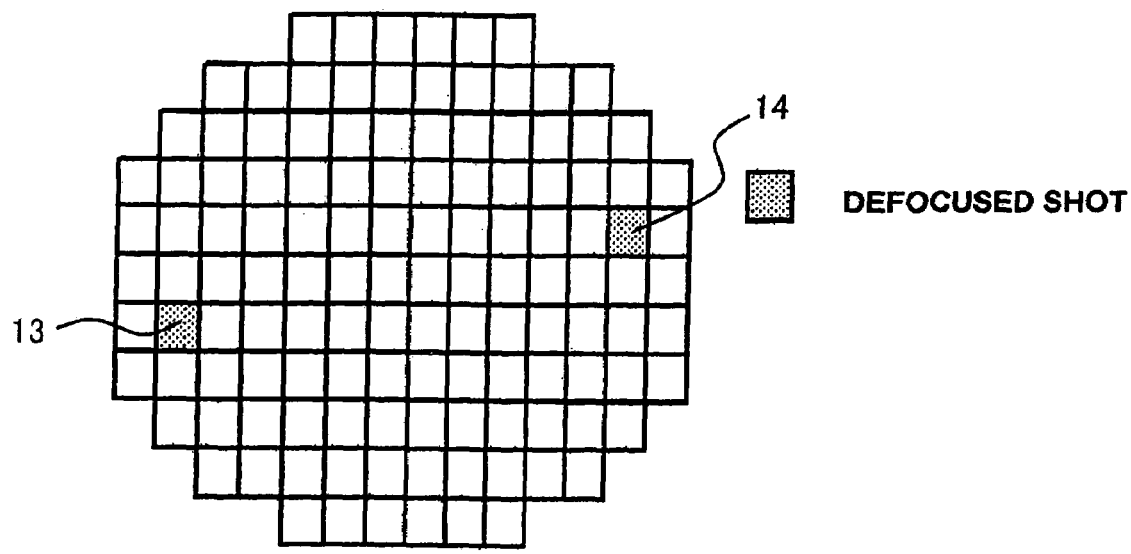
Figure 11:
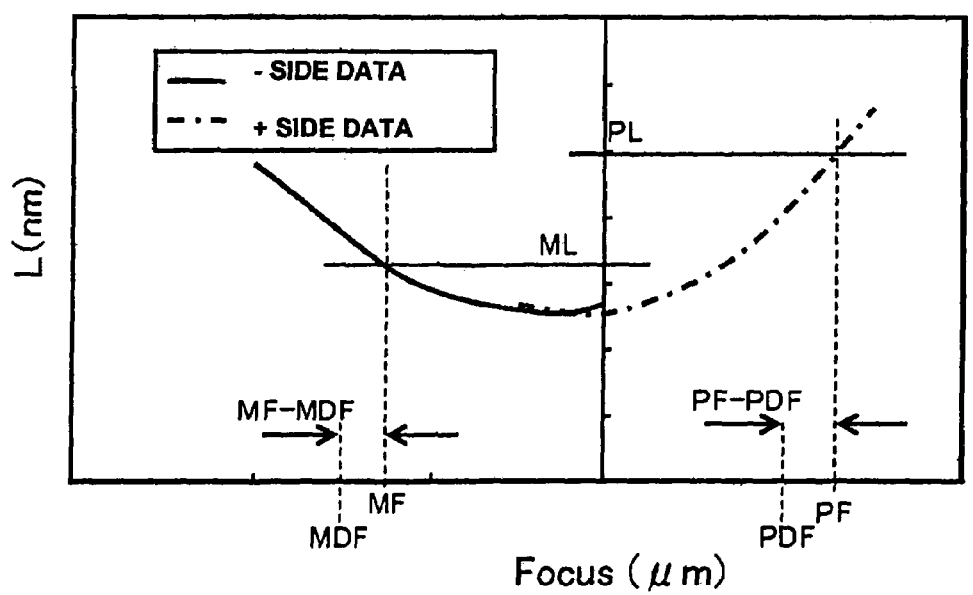
Figure 12:
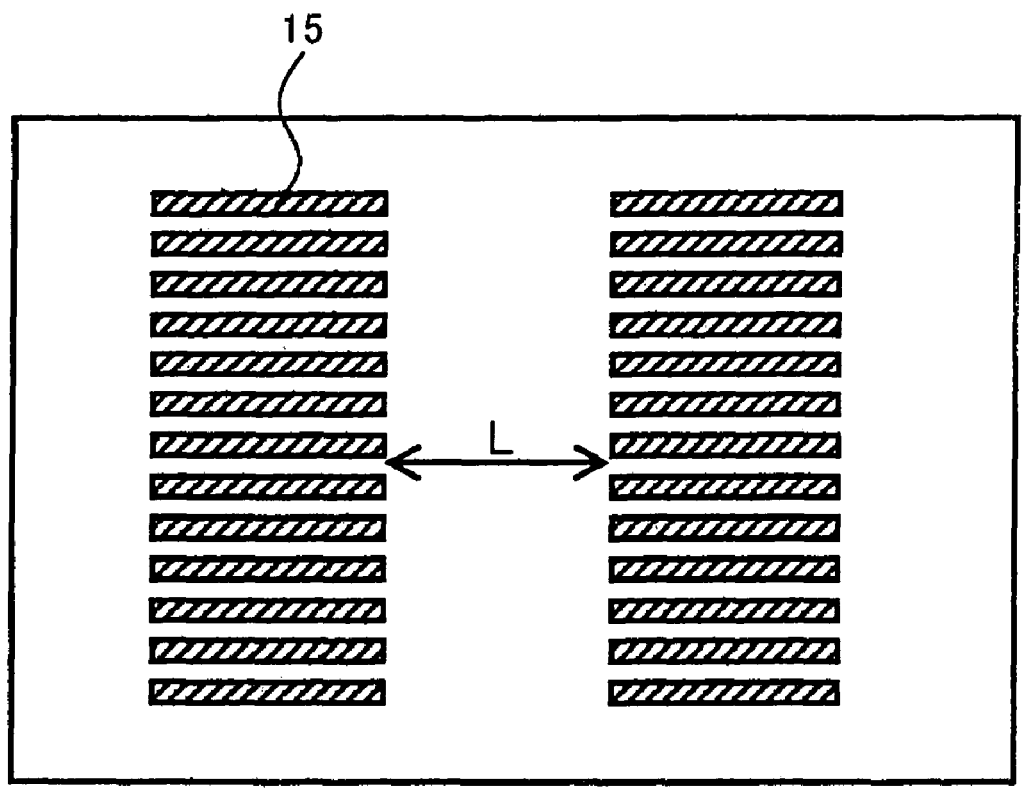
Figure 13:
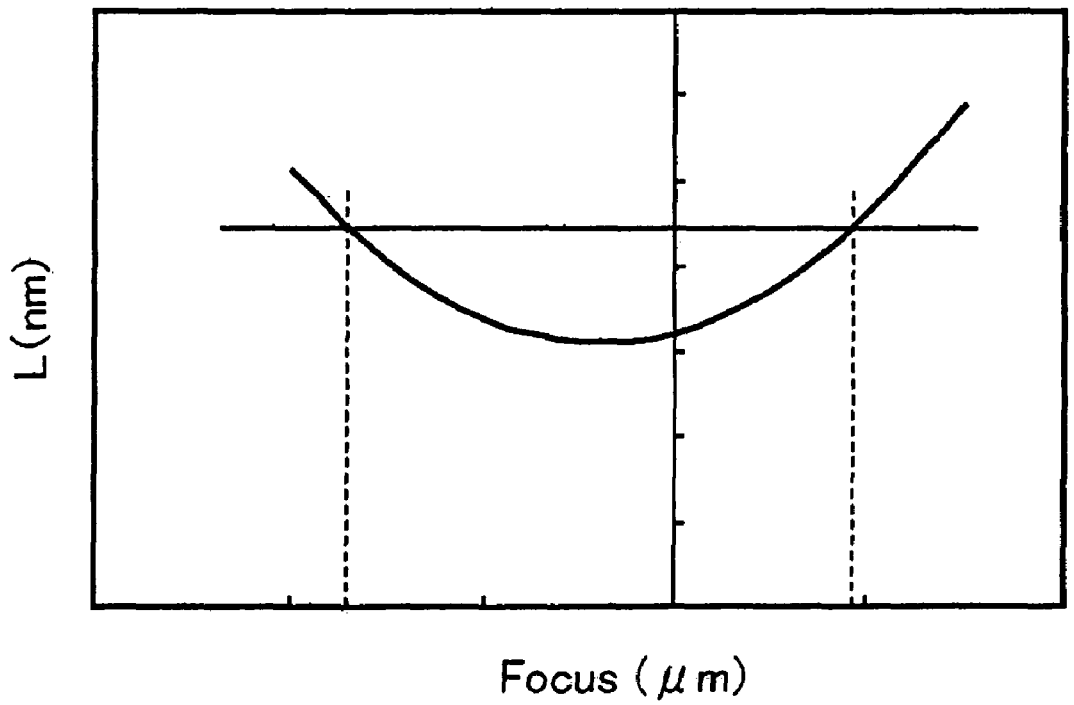
Figure 15:
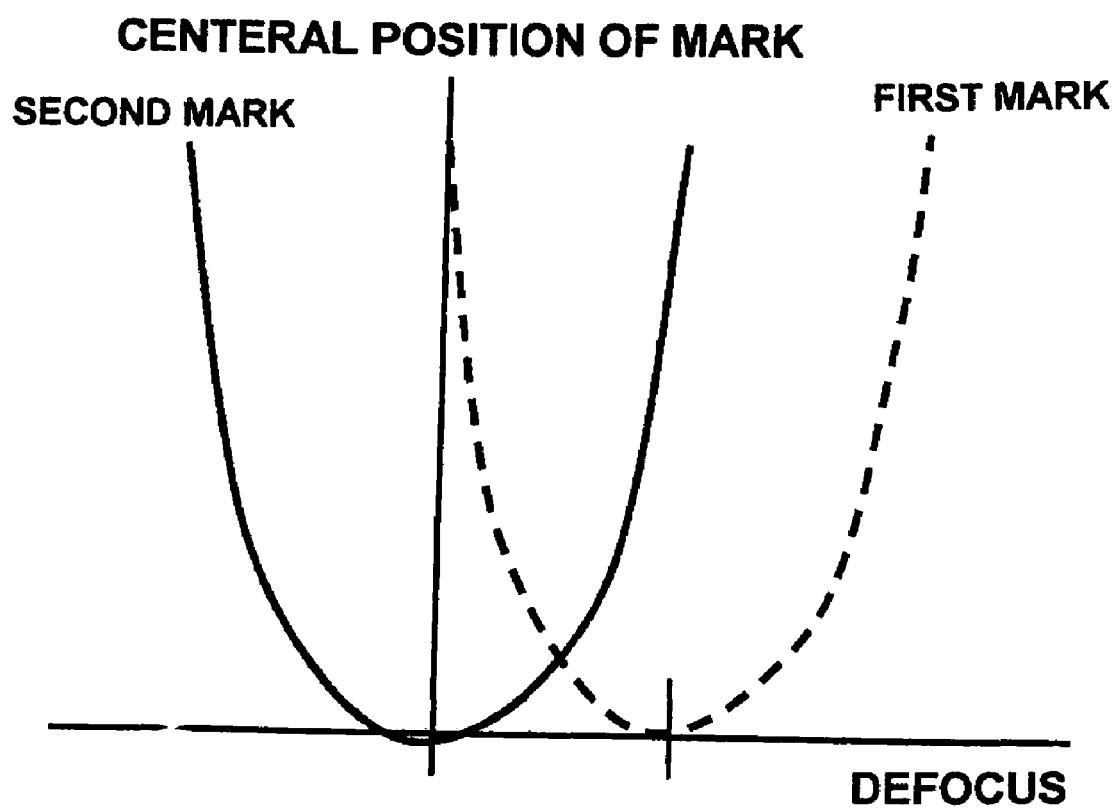
Figure 16:
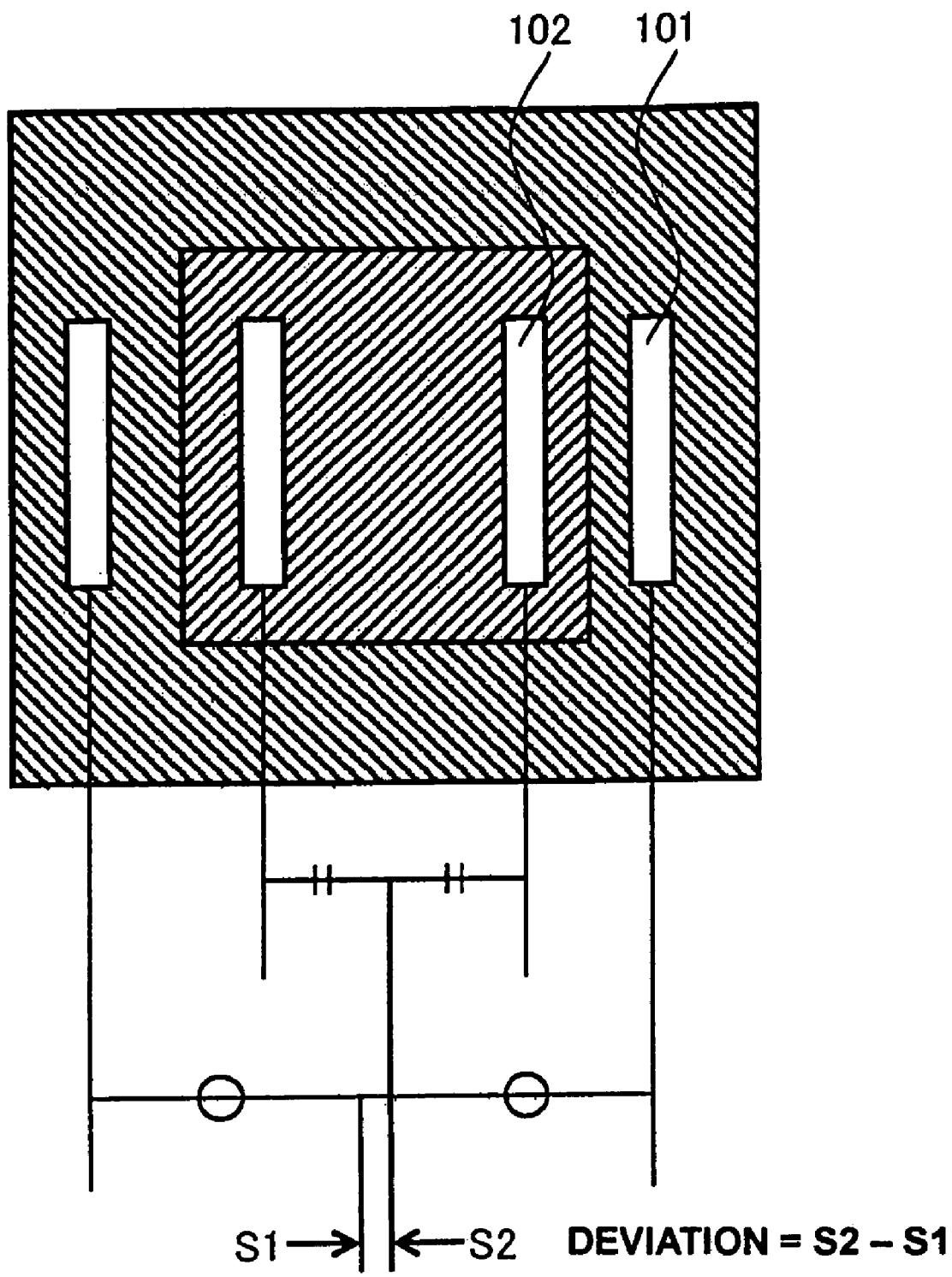
Figure 17:
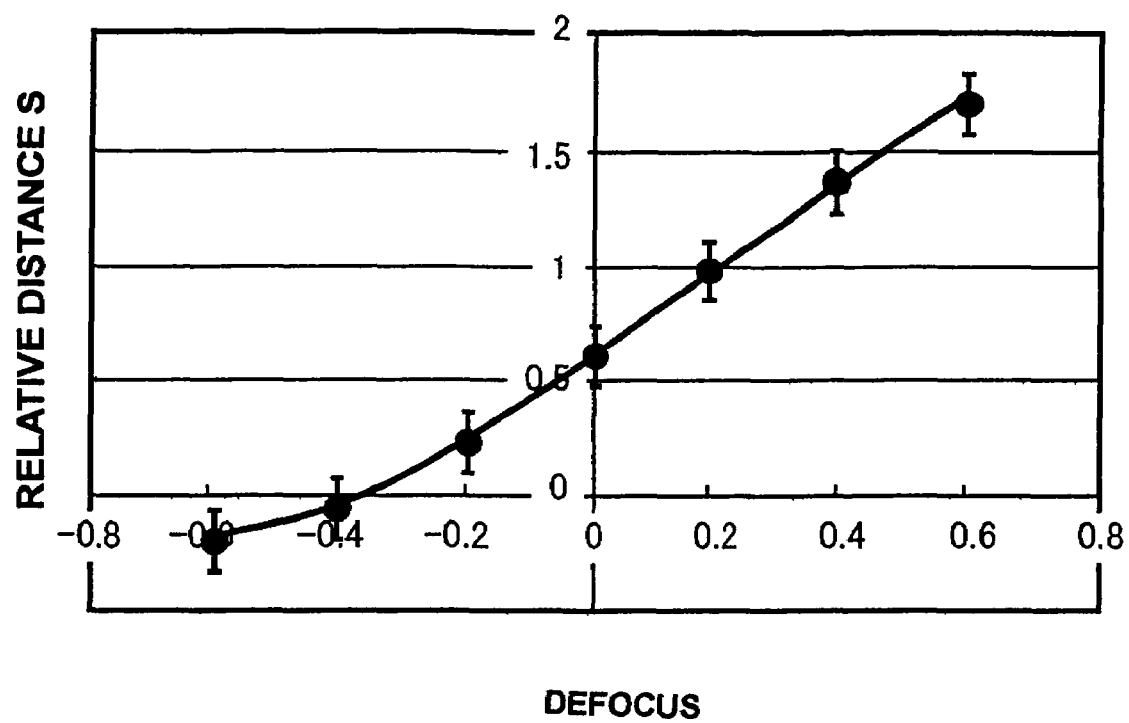

FIGS. 4($a$), 4($b$), and 4($c$) are graphs showing the relationships between an exposure dose and several coefficients of the calibration quadratic function curve according to the second embodiment of the present invention;

FIG. 5 is a graph showing an exposure dependency of the calibration quadratic function curve of a variation of the focus mark according to the second embodiment of the present invention;

FIG. 6 is a diagram showing an example of shot layout according to the first and second embodiments of the present invention;

FIG. 7 is a graph showing a fitting error between the dimension of a focus mark and the calibration quadratic function curve according to the second embodiment of the present invention;

FIG. 8 is a diagram showing a calculation method of the magnitude of deviation from the optimum focus and the direction of deviation according to the present invention;

FIGS. 9($a$) and 9($b$) are graphs showing the calibration quadratic function curve between the focus mark and the focus position according to the third embodiment of the present invention;

FIG. 10 is a diagram showing an example of shot layout according to the fourth embodiment of the present invention;

FIG. 11 is a diagram showing the calculation method of a magnitude of deviation from the optimum focus and the direction of deviation according to the fourth embodiment of the present invention;

FIG. 12 is a plan view of a focus mark according to the prior art;

FIG. 13 is a graph showing the relationship between a focus dimension and a focus position of a focus mark according to the prior art;

FIGS. 14 ($a$), 14($b$), 14($c$), and 14($d$) are diagrams showing the prior art;

FIG. 15 is a diagram showing the focus position dependency of the central position of a focus mark according to the prior art;

FIG. 16 is a diagram showing the focus-monitoring pattern according to the prior art; and FIG. 17 is a graph showing the relationship between the relative distance of central positions of two different marks and the focus position according to the prior art.

DETAILED DESCRIPTION OF THE PRESENT INVENTION

Embodiments of the present inventions will now be described with reference to the accompanying drawings.

First Embodiment

In this embodiment, it is described how to determine the magnitude of deviation or dislocation of an actual focus position of a shot, which has been transferred onto a wafer at an optimum focus position, from the optimum focus position where the desired or predetermined characteristics of a manufactured product are obtained. First of all, as shown in FIG. 12, a reticule which carries a focus-monitoring pattern formed by a plurality of fine lines 15 and a device pattern region forming a semiconductor device are prepared. Then, how to make a calibration quadratic function curve, which shows the relationship between the dimension and the focus position of the focus-monitoring mark, is described.

As described in the background section of this specification, the quantity of retreat of the ends of the fine lines 15 shown in FIG. 12 is sensitive with respect to focus. High precision of the focus-monitoring becomes possible by monitoring the magnitude of retreat of the ends of the fines lines 15. Here, a distance L (FIG. 12) between the focus-monitoring marks is optically measured to monitor the magnitude of retreat of the ends of the fine lines 15.

Then, the dimension L is measured by a dimension measuring tool by intentionally changing the focus position. The relationship between the dimension L and the focus position is shown in FIG. 8. The horizontal axis represents the focus position, wherein the optimum focus position to the device region is located at the origin of the coordinate axes, while the vertical axis represents the dimension L. The dimension L varies substantially symmetrically with respect to the change of the focus position. The calibration quadratic function curve is made by fitting data with a quadratic function curve. The calibration quadratic function curve is represented by the following formula:

$$y = a + b(x-c)^2 \tag{1}$$

wherein y is the dimension L, x is the focus position, and a, b, and c are coefficients. In FIG. 8, the calibration quadratic function curve takes the extreme value at a focus position Fk.

A reticule pattern including the focus-monitoring marks is, transferred onto a wafer at the optimum focus position to the device pattern region. At this point, at least one shot is taken at the focus position which is sufficiently defocused relative to the focus position Fk or the extreme value of the calibration quadratic function curve. Here, a shot is taken at a focus position ΔDF (FIG. 8), which is minus direction relative to the position Fk. In FIG. 6, an example of shot layout is shown.

The dimension L of the focus-monitoring mark, which has been transferred onto a wafer at the defocused focus position, is measured. In FIG. 8, the measuring result is shown as a dimension La.

Then, an actual focus position F of the shot transferred at the focus position ΔDF is calculated using the dimension La and the calibration quadratic function curve. The dimension La is substituted in y in the calibration quadratic function curve (1) to calculate the actual focus position x=F. At this point, the focus position x has two solutions as shown by the following formula:

$$x = c \pm \sqrt{\{(y-a)/b\}} \qquad (2)$$

In the embodiment, the value of focus position ΔDF is smaller than that of the focus position Fk, and the actual focus position F has a smaller one in the two solutions. Namely, the actual focus position F is given by $$F = c - \sqrt{\{(\Delta La - a)/b\}} \qquad (3)$$

This is because the magnitude of the deviation of the actual focus position of a shot transferred at the defocused focus position from the defocused focus position ΔDF is usually less than 0.05 μm, which is sufficiently smaller than the magnitude of defocus ΔDF that is intentionally predetermined as more than approximately 0.1 μm. Accordingly, the magnitude of the defocus between the focus position ΔDF and the focus position Fk, where the dimension L takes the extreme value, coincides with the magnitude of the solutions determined from the calibration quadratic function curve with extremely high probability.

From the above, the difference F–ΔDF between the actual focus position F of the shot that has been transferred at the focus position defocused in this way and the defocused focus position ΔDF, represents the magnitude and the direction of the deviation of focus position F from the focus position ΔDF.

Also, the difference F–ΔDF is taken as the magnitude and direction of the deviation of the actual focus position of a shot, which has been transferred at the optimum focus position for the device region of the wafer, from the optimum focus position. This is because the unevenness of the surface of a wafer, which has been caused by mechanical impreciseness of exposure equipment and/or irregularity of process condition, is considered the same at the optimum focus position and the defocused focus position if the shots are made on the same wafer, which has been processed with the same condition and exposured by the same exposure equipment. Accordingly, the focus deviation caused by the unevenness of the wafer surface is also the same among shots.

As fully described above, the actual focus position of the shot, which has been transferred onto the wafer at the defocused focus position, is determined uniquely by the focus-monitoring method where the reticule pattern including the focus-monitoring mark is transferred onto the wafer at the intentionally defocused focus position. Thus, the direction of deviation of the actual focus position, which has been transferred at the optimum focus position for the device pattern region, from the optimum focus position, is determined uniquely by the sign of the difference F–ΔDF, as well as the absolute magnitude of the deviation.

Since the direction of deviation is uniquely determined, it is possible to correct the direction of deviation, making it possible to control the focus condition with more precisely than the conventional control of the focus condition with only the absolute magnitude of deviation.

Also, as understood clearly from FIG. 8, the actual focus position is calculated more precisely by finding the focus position F in the defocused region because the changing magnitude in the direction of y of the focus position F is greater than that in the vicinity of the focus position Fk, which is located at the extreme value in the calibration quadratic function curve. Consequently, the magnitude and the direction F–ΔDF of deviation of the actual focus position of a shot, which has been transferred at the optimum position for the device region of the wafer, from the optimum focus position can be calculated more precisely.

Since the focus position in respect to the dimension L is generally not sensitive in the vicinity of the focus position Fk located at the extreme value of the calibration quadratic function curve, the fitting error between the calibration quadratic function curve and actual measurement tends to be larger. Accordingly, the precision of calculation of the focus position in a wafer according to the conventional method has not been sufficient because a shot in the vicinity of the focus position at the extreme value is measured in the conventional method. In this present invention, however, the focus position F, which is calculated precisely from the focus range where the fitting error is small, is used by setting the defocused focus position at a position defocused from the focus position Fk by a certain amount. Consequently, the calculation preciseness of the magnitude and the direction F–ΔDF of deviation of the actual focus position of a shot, which has been transferred at the optimum position for the device region of the wafer, from the optimum focus position, is increased.

As fully described above, since the focus monitoring method in this embodiment monitors not only the direction of deviation but also the magnitude of deviation of the precisely calculated actual focus position from the defocused focus position, a suitable feedback on the focus conditions of exposure equipment can be obtained.

The defocus in the lithography process is reduced by the suitable and precise control, thereby reducing the manufacturing cost of a semiconductor device with high manufacturing yield. In addition, it is not necessary to make a special reticule described in Japanese Patent Application Kokai Number 2001-189264, thus further reducing the manufacturing cost.

In this embodiment, the focus-monitoring mark shown in FIG. 12 is used and the dimension thereof is measured optically (by microscope), however, other measuring methods, such as superposing measurement instrument, can be used. Also, as described in the following embodiments, a method of monitoring such patterns as shown in FIGS. 1(*a*) and 1(*c*), and FIGS. 1(*b*) and 1(*d*) by means of the superposing measurement instrument can produce the similar effect. In this embodiment, the magnitude of retreat of the ends of fine lines is monitored. However, other focus-monitoring patterns, such as a single pattern having lines & spaces, can be used. In this embodiment, only one defocused shot is used, however, by increasing the number of defocused shots to provide the average of actual focus positions, the magnitude and the direction F–ΔDF of deviation between the averaged focus position and the defocused focus position are found, thereby to increase the precision.

Second Embodiment

The second embodiment of the present invention will be now described below. In the second embodiment, a focus-monitoring mark other than that used in the first embodiment is used and the dimension relative to the focus position is variable because of the exposure magnitude dependency. Also, a method by which the magnitude of an intentional defocus is made optimum is described.

A reticle according to the second embodiment comprises a device pattern region forming a semiconductor device and a focus-monitoring mark region. FIG. 1(a) shows the shape of the focus-monitoring mark and FIG. 1(c) shows the enlarged focus-monitoring mark comprising a portion 11 having fines lines formed perpendicular to the line of the focus-monitoring mark and a portion 12 having no such lines. As described in the first embodiment, the positions of the ends of the fine lines change with high sensitivity in respect to focus. Accordingly, the deviation of the focus position can be monitored precisely by monitoring the magnitude of retreat of the ends of the fine lines.

In this embodiment, the magnitude of retreat of the ends of the fine lines is not monitored directly. As shown in FIG. 1(c), the difference L (hereinafter "dimension") in the position of a center of balance between the portion 11 with the fines lines and the portion 12 without the fines lines, which is produced with the retreat of the fine lines, is measured by using an optical overlay metrology tool. Here, the focus-monitoring mark is measured as an optically contrastive image in the overlay metrology tool. The contrastive image in the vertical direction with respect to the mark is shown in FIG. 1(c). The portion 11 having fine lines seen along a dotted line 21 and the portion 12 having no fine lines seen along a dotted line 22 are shown as an image 31 and an image 32, respectively. In each of the images 31 and 32, the position of a center of balance, that is, the position of the perpendicular line dividing equally the area of the image, is found. Consequently, the magnitude of retreat of the ends of lines is monitored by measuring the difference in the position of a center of balance (dimension) L. Since the magnitude of retreat in the portion 11 having the fine lines is changed sensitively to focus, the dimension L is also changed sensitively to focus.

Figure 2:
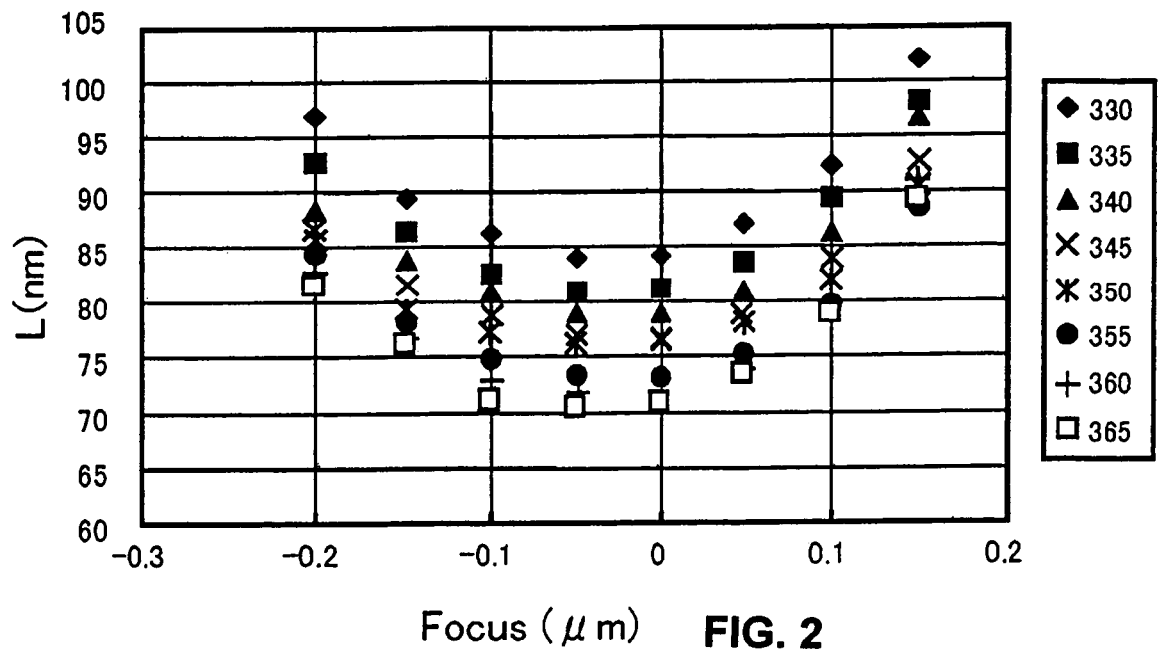
FIG. 2 is a graph showing the relationship between the focus dimension and the focus position of a focus mark according to the second embodiment of the present invention.

The reticule is transferred onto a wafer by exposure equipment changing the magnitude of exposure and the focus position changed, wherein the magnitude or dose of exposure is divided into every 5 J/m² in the range between 330 J/m² and 365 J/m², and the focus position is divided into every 0.05 µm in the range between −0.2 µm and 0.15 µm. The dimension L of the focus-monitoring mark (FIG. 1(a)) is measured under respective conditions of the exposure and the focus position. The result is shown in FIG. 2. The horizontal axis represents the focus position, where the optimum focus for the device pattern region is located at the origin of the coordinate axes, and the vertical axis represents the dimension L measured by the superposing measurement instrument for the focus-monitoring mark. Here, the optimum focus means s focus position capable of obtaining the desired characteristics of a product). The dimension L according to this embodiment has the exposure dependency. For the calculation of the focus position, the magnitude or dose of exposure must be taken into account.

Figure 3:
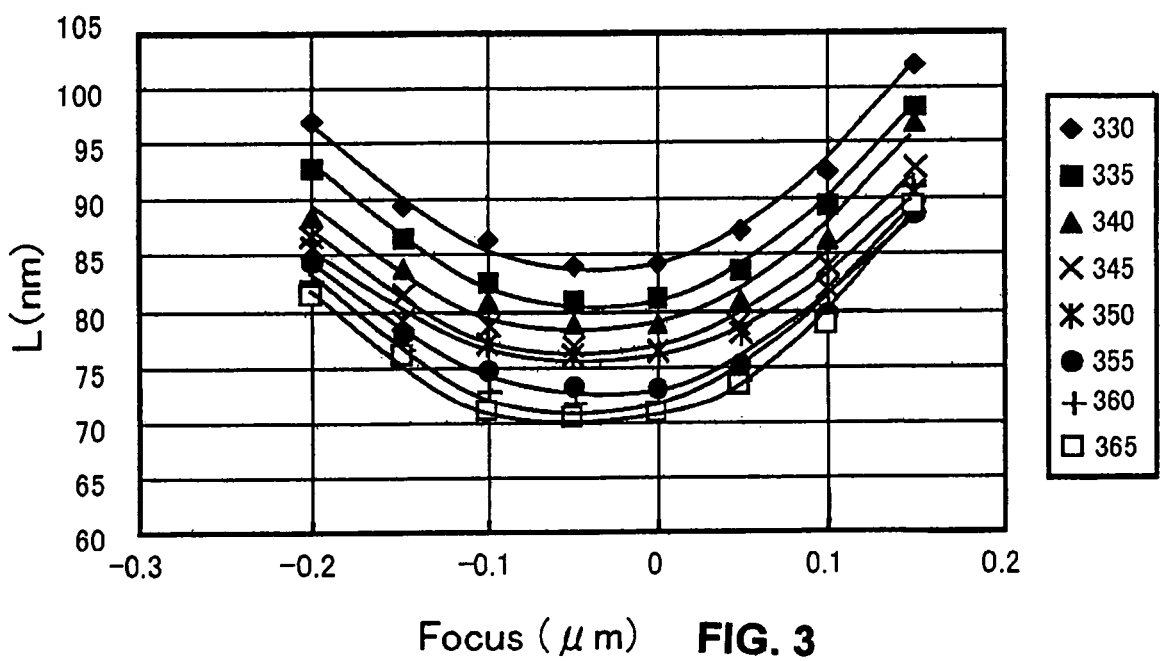
FIG. 3 is a graph showing a calibration quadratic function curve between the focus mark and the focus position according to the second embodiment of the present invention.

Data obtained from the measurement of the dimension is shown in FIG. 2. The data shown in FIG. 2 can be substantially represented by the following quadratic function:

$$Y=a+b(x-c)^2 \quad (4)$$

wherein, y is the dimension L, x is the focus position, and a, b, and c are coefficients. Calibration quadratic function curves in FIG. 3 show the relationship between the dimension L of the focus-monitoring mark and the focus position, which are measured under respective doses of exposure.

In FIG. 4(a), 4(b), and 4(c), the horizontal axis represents the dose of exposure and the vertical axis represents the coefficients a, b, and c, respectively, in the calibration quadratic function curve for the respective exposure. As clearly shown in the drawings, the coefficients a, b, and c change linearly in respect to the exposure dose. A linear expression of the exposure dose dependency of the respective coefficients is created by the least square approximation of the data. Constants a, b, and c can be calculated from an arbitrary exposure dose using the linear expression of the exposure dose dependency.

Thus, the calibration quadratic function curve for the focus position relative to an arbitrary exposure dose can be determined uniquely by creating the calibration quadratic function curve for the focus position and the linear expression of the exposure dose dependency of the coefficients of the calibration quadratic function curve.

How to find the magnitude and direction of the deviation of the actual focus position on a wafer in manufacturing process of a semiconductor process from the optimum focus position will be described below with reference to FIG. 8.

The above-mentioned reticle is transferred onto a wafer with the optimum focus position for the device pattern region. At this point, in the same way as in the first embodiment, a shot, which is defocused by a certain value from the focus position at the extreme value of the calibration quadratic function curve, is produced on the same wafer. The focus position of the shot is presumed to be ΔDF (refer to FIG. 8). An example of the shot layout is shown in FIG. 6.

As described before, the dimension L of the focus mark is generally not sensitive to the focus position in the vicinity of the optimum focus position, that is, in the vicinity of the focus position at the extreme value of the calibration quadratic function curve. Accordingly, the fitting error in the vicinity of the optimum focus position is large and the fitting error becomes smaller with the progress of the defocus. In FIG. 7, the fitting error of the calibration quadratic function curve shown in FIG. 3 is expressed. From FIG. 7, it becomes clear that the change of the fitting error in respect to the change of the focus is controlled and stable in the range of the fitting error of ±20 nm. Accordingly, the defocused focus position ΔDF is set in the range of the fitting error of ±20 nm to minimize the calculation error of the actual focus position.

In this embodiment, judging from FIG. 7, it is desirable that the defocused focus position ΔDF is set at −0.15 µm or 0.1 µm. FIG. 8 is drawn with the defocused focus position ΔDF at −0.15 µm when the focus position ΔDF is defocused in the minus (smaller) direction from the focus position Fk at the extreme value.

The dimension L of the focus-monitoring mark in the shot at the defocused focus position ΔDF is measured by the overlay metrology tool. The coefficients a, b, and c of the calibration quadratic function curve (4) are calculated from the exposure dose, which is input into exposure equipment or calculated from the exposure dose monitor, and the exposure dose dependency linear expression of the constants of the calibration quadratic function curve to determine the calibration quadratic function curve (4) uniquely.

The measured dimension L of the focus-monitoring mark is substituted in y in the uniquely determined calibration quadratic function curve (4) to calculate the actual focus position x=F (FIG. 8). At this point, the focus position x has two solutions as shown by the following formula:

$$x = c \pm \sqrt{\{(y-a)/b\}} \quad (5)$$

In this case, it is understood that when the defocused position ΔDF is smaller than the focus position Fk, F is taken as smaller one in the two solutions, and the defocused position ΔDF is larger than the focus position Fk, F is taken as larger one in the two solutions. This is because, as described in the first embodiment, the magnitude between the focus position ΔDF and the focus position Fk, where the dimension L takes the extreme value, that is, which is smaller, ΔDF or Fk, coincides, with extremely high probability, with the magnitude of the solutions determined from the calibration quadratic function curve, that is, which one of the two solutions is smaller.

In the embodiment, since the focus position ΔDF is smaller than the focus position Fk, which is 10.05 μm in this embodiment from Fog. 3, the actual focus position F is taken as smaller one in the two solutions. Namely, the F is represented as follows:

$$F = c - \sqrt{\{(\Delta L - a)/b\}} \quad (6)$$

As described in the first embodiment, a difference F−ΔDF (FIG. 8), which is the difference between the actual focus position F of the shot that has been transferred at the focus position defocused in this way and the defocused focus position, represents the magnitude and the direction of the deviation of the actual focus position F from the optimum focus position.

Thus, even if the dimension of the focus-monitoring mark has the exposure dose dependency, high monitoring precision is maintained by creating the linear expression of the exposure dose dependency for the coefficients of the calibration quadratic function curve. Further, still higher monitoring precision is maintained by positively using the region, where the fitting error of the calibration quadratic function curve is small.

The exposure dose dependency of the coefficients of the calibration quadratic function curve is not peculiar to the mark shown in FIG. 1(a) but applicable the mark shown in FIG. 12 as shown in FIG. 5.

Third Embodiment

A focus-monitoring method according to the third embodiment will be now described, wherein the dimension is asymmetric in respect to the focus position in accordance with the second embodiment. A reticule according to the third embodiment comprises, like the second embodiment, a device pattern region becoming a semiconductor device and a focus-monitoring mark region (FIG. 1(a)) having fines lines perpendicular to the mark.

The reticule is transferred onto a wafer by exposure equipment changing the magnitude of exposure and the focus position changed, wherein the magnitude or dose of exposure is divided into every 5 J/m$^2$ in the range between 330 J/m$^2$ and 365 J/m$^2$, and the focus position is divided into every 0.05 μm in the range between −0.2 μm and 0.15 μm. The dimension L of the focus-monitoring mark (FIG. 1(a)) is measured, in the same way as in the second embodiment, under the respective conditions of the exposure and the focus position by exposing measurement instrument.

Here, a case is considered, wherein data of the dimension L and the focus position of is asymmetric between the plus direction and the minus direction of the data. In such a case, the fitting error of the calibration quadratic function curve becomes larger and the precision of focus monitoring is reduced. The measured data is divided into the plus focus direction and minus focus direction with respect to the focus position at the extreme of the calibration quadratic function curve. The respective divided data is approximated to the following quadratic function:

$$y = a + b(x-c)^2 \quad (7)$$

$$y = a' + b'(x-c')^2 \quad (8)$$

wherein the formula (7) is the calibration quadratic function curve in the plus direction and the formula (8) is that in the minus direction. The respective constants a, b, c, a', b', and c' of the plus and minus directions are calculated. The approximation is performed for all exposure doses to create the calibration quadratic function curves representing the relationship between the focus-monitoring mark and the dimension L in the plus and minus directions shown in FIGS. 9(a) and 9(b), respectively, wherein the horizontal axis show the focus position and the vertical axis the dimension L.

It should be noted that in the present invention, the plus and minus focus directions possess only a relative meaning. Namely, when the direction where a wafer and a reticule are physically approaching to each other is defined as the plus direction, the direction where they are receding from each other is the minus direction. In the reverse, when the direction where a wafer and a reticule are physically receding from each other is defined as the plus direction, the direction where they are approaching to each other is the minus direction.

Then, in the same way as in the second embodiment, the linear expressions of the exposure dependency for the coefficients a, b, and c, which change linearly in respect to the exposure dose, are created for the plus and minus directions, respectively. Constants a, b, c, a', b', and c' can be calculated from an arbitrary exposure dose using the linear expressions of the exposure dose dependency.

The reticule is transferred onto a wafer with the optimum focus for the device pattern region in the same way as in the second embodiment. At this point, a shot, which is defocused by a certain value from the focus position at the extreme value of the calibration quadratic function curve, is produced on the same wafer. The focus position of the shot is presumed to be ΔDF (refer to FIG. 8).

The magnitude and the direction F−ΔDF of the deviation of the actual focus position of the shot, which has been transferred onto the wafer at the defocused focus position, from the defocused focus position using the dimension L of the focus-monitoring mark of the defocused shot. Here, when the defocused focus position is smaller than the focus position at the extreme value of the calibration quadratic function curve, the calibration quadratic function curve created for the minus focus direction is used and when the defocused focus position is larger than the focus position at the extreme value, the calibration quadratic function curve created for the plus focus direction is used.

By using the calibration quadratic function curve, which is divided into the plus and minus directions and approximated, even when the data of the dimension L and the focus position are asymmetric each other in respect to the plus and minus focus directions, the precision of the calibration is increased. Consequently, the precision of the calculation of the magnitude and the direction of the deviation of the actual focus position, which has been transferred onto the wafer with the optimum focus, from the optimum focus position is increased.

According to the focus-monitoring method described in the third embodiment, the control of the focus conditions of exposure equipment becomes possible, capable of feedback more suitable than those in the first and second embodiments.

Fourth Embodiment

The focus-monitoring method according to the fourth embodiment will be described. In this embodiment, the magnitude and the direction of the deviation of the actual focus position on a wafer from the optimum focus can be calculated with still more precisely based upon the third embodiment as shown in FIG. 11.

First, in the same way as in the third embodiment, the calibration quadratic function curve and the linear expression of the exposure dose dependency are created for the plus and minus directions, respectively. The reticle is transferred onto a wafer with the optimum focus. At this point, one shot, which is taken at a position PDF defocused in the plus direction or plus side by a certain amount from the focus position at the exremal value of the calibration quadratic function curve, and another shot, which is taken at a position MDF defocused in the minus direction or minus side by a certain amount, are produced on the same wafer. An example of the shot layout is shown in FIG. 10. A reference numeral 13 is the shot defocused in the plus direction and a reference numeral 14 is the shot defocused in the minus direction/

The dimension L of the focus-monitoring mark (FIG. 1(*a*)) of the respective shots is measured, wherein the measurement result in the plus direction is expressed as a dimension PL and that in the minus direction as a dimension ML. When the actual focus position is calculated, in case of the plus defocus position PDF, the calibration curve in FIG. 7 and the plus dimension PL are used to calculate a plus focus position PF, and in case of the minus defocused position, the calibration curve in FIG. (8) and the minus dimension MD are used to calculate a minus focus position MF. The average of differences between the respective plus and minus focus positions PF and MF and the respective defocused plus and minus positions PDF and MDF is defined as the magnitude and the direction of the deviation of the actual focus position on the wafer from the optimum focus. The average of the differences is calculated by the following formula:

$$\{(PF-PDF)+(MF-MDF)\}/2 \qquad (9)$$

Here, only one defocused shot is taken in the plus and minus focus directions, respectively. However, it is possible to take a plurality of shots in the plus and minus focus directions, respectively in order to use the average of all the taken shots.

When a systematic error of the process condition or equipment condition between the plus and minus focus directions exists, it mitigates the reduction of the precision caused by the systematic error to use both the measurement results of the shots taken in the plus and minus focus directions. Therefore, even if the systematic error, which is usually difficult to be found, exists, the magnitude and direction of the deviation from the optimum focus in a wafer can be monitored with high precision.

According to the focus-monitoring method of the fourth embodiment, the monitoring of the focus conditions of exposure equipment becomes possible with feedback more suitable than that in the third embodiment.

The invention claimed is:

1. A method of monitoring a magnitude and a direction of deviation of a first actual focus position of a focus-monitoring mark included in a reticle pattern, from an optimum focus position, said reticle pattern having been transferred onto a wafer at said optimum focus position by photolithography, said method comprising the steps of:
   (1) creating a calibration quadratic function curve representing a relationship between a dimension and a focus position of said focus-monitoring mark transferred onto said wafer;
   (2) transferring at least one shot of said focus-monitoring mark onto said wafer at a first focus position, which is defocused by a certain amount from a second focus position where said calibration quadratic function curve takes an extreme value thereof;
   (3) measuring a dimension of said focus-monitoring mark, which has been transferred onto said wafer in said step (2);
   (4) calculating a second actual focus position of said focus-monitoring mark, which has been transferred onto said wafer in said step (2), by using said calibration quadratic function curve and said dimension measured in said step (3), wherein when said first focus position is smaller than said second focus position, a smaller solution of two solutions found from said calibration quadratic function curve is determined as said second actual focus position, and when said first focus position is larger than said second focus position, a larger solution of said two solutions is determined as said second actual focus position; and
   (5) subtracting said first focus position from said second actual focus position to find said magnitude and said direction of said deviation of said first actual focus position from said optimum focus position.

2. The method according to claim 1, wherein said first focus position is selected from a range where a fitting error of said calibration quadratic function curve is within ±20 nm.

3. The method according to claim 1, which further comprises, after said step (1) but before said step (4), the steps of:
   (6) creating a linear expression of an exposure dose dependency of coefficients in said calibration quadratic function curve; and
   (7) determining said calibration quadratic function curve uniquely, which is used in said step (4), by using a monitored exposure dose or a predetermined exposure dose and said linear expression of said exposure dose dependency.

4. The method according to claim 2, which further comprises, after said step (1) but before said step (4), the steps of:
   (6) creating a linear expression of an exposure dose dependency of coefficients in said calibration quadratic function curve; and
   (7) determining said calibration quadratic function curve uniquely, which is used in said step (4), by using a monitored exposure dose or a predetermined exposure dose and said linear expression of said exposure dose dependency.

5. The method according to claim 1, wherein, in said step (1), two new calibration quadratic function curves are created, one of which is created in a plus direction with respect to said second focus position and the other of which is created in a minus direction with respect to said second focus position, and in said step (4), if said first focus position is smaller than said second focus position, said calibration quadratic function curve in said minus direction is used to calculate said second actual focus position, and if said first focus position is larger than said second focus position, said calibration quadratic function curve in said plus direction is used to calculate said second actual focus position.

6. The method according to claim 2, wherein, in said step (1), two new calibration quadratic function curves are created, one of which is created in a plus direction with respect to said second focus position and the other of which is created in a minus direction with respect to said second focus position, and in said step (4), if said first focus position is smaller than said second focus position, said calibration quadratic function curve in said minus direction is used to calculate said second actual focus position, and if said first focus position is larger than said second focus position, said calibration quadratic function curve in said plus direction is used to calculate said second actual focus position.

7. The method according to claim 3, wherein, in said step (1), two new calibration quadratic function curves are created, one of which is created in a plus direction with respect to said second focus position and the other of which is created in a minus direction with respect to said second focus position, and in said step (4), if said first focus position is smaller than said second focus position, said calibration quadratic function curve in said minus direction is used to calculate said second actual focus position, and if said first focus position is larger than said second focus position, said calibration quadratic function curve in said plus direction is used to calculate said second actual focus position.

8. The method according to claim 4, wherein, in said step (1), two new calibration quadratic function curves are created, one of which is created in a plus direction with respect to said second focus position and the other of which is created in a minus direction with respect to said second focus position, and in said step (4), if said first focus position is smaller than said second focus position, said calibration quadratic function curve in said minus direction is used to calculate said second actual focus position, and if said first focus position is larger than said second focus position, said calibration quadratic function curve in said plus direction is used to calculate said second actual focus position.

9. The method according to claim 5, wherein, in said step (2), at least one shot of said focus-monitoring mark is transferred at a plus focus position with respect to said second focus position, and at least one shot of said focus-monitoring mark is transferred at a plus focus position with respect to said second focus position, and in said step (4), said calibration quadratic function curve created in said plus direction is used for said at least one shot transferred at said plus focus position and said calibration quadratic function curve created in said minus direction is used for said at least one shot transferred at said minus focus position to calculate said second actual focus positions of said respective shots, thereby to find said magnitude and said direction of said deviation of said first actual focus position from said optimum focus position by calculating an average of magnitudes and directions of deviations of said calculated second actual focus positions from said plus and minus focus positions.

10. The method according to claim 6, wherein, in said step (2), at least one shot of said focus-monitoring mark is transferred at a plus focus position with respect to said second focus position, and at least one shot of said focus-monitoring mark is transferred at a plus focus position with respect to said second focus position, and in said step (4), said calibration quadratic function curve created in said plus direction is used for said at least one shot transferred at said plus focus position and said calibration quadratic function curve created in said minus direction is used for said at least one shot transferred at said minus focus position to calculate said second actual focus positions of said respective shots, thereby to find said magnitude and said direction of said deviation of said first actual focus position from said optimum focus position by calculating an average of magnitudes and directions of deviations of said calculated second actual focus positions from said plus and minus focus positions.

11. The method according to claim 7, wherein, in said step (2), at least one shot of said focus-monitoring mark is transferred at a plus focus position with respect to said second focus position, and at least one shot of said focus-monitoring mark is transferred at a plus focus position with respect to said second focus position, and in said step (4), said calibration quadratic function curve created in said plus direction is used for said at least one shot transferred at said plus focus position and said calibration quadratic function curve created in said minus direction is used for said at least one shot transferred at said minus focus position to calculate said second actual focus positions of said respective shots, thereby to find said magnitude and said direction of said deviation of said first actual focus position from said optimum focus position by calculating an average of magnitudes and directions of deviations of said calculated second actual focus positions from said plus and minus focus positions.

12. The method according to claim 8, wherein, in said step (2), at least one shot of said focus-monitoring mark is transferred at a plus focus position with respect to said second focus position, and at least one shot of said focus-monitoring mark is transferred at a plus focus position with respect to said second focus position, and in said step (4), said calibration quadratic function curve created in said plus direction is used for said at least one shot transferred at said plus focus position and said calibration quadratic function curve created in said minus direction is used for said at least one shot transferred at said minus focus position to calculate said second actual focus positions of said respective shots, thereby to find said magnitude and said direction of said deviation of said first actual focus position from said optimum focus position by calculating an average of magnitudes and directions of deviations of said calculated second actual focus positions from said plus and minus focus positions.

* * * * *